(12) United States Patent
Froment et al.

(10) Patent No.: US 7,638,427 B2
(45) Date of Patent: Dec. 29, 2009

(54) MOS TRANSISTOR WITH FULLY SILICIDED GATE

(75) Inventors: Benoît Froment, Grenoble (FR); Delphine Aime, Grenoble (FR)

(73) Assignee: STMicroelectronics (Crolles 2) SAS, Crolles Cedex (FR)

( * ) Notice: Subject to any disclaimer, the term of this patent is extended or adjusted under 35 U.S.C. 154(b) by 539 days.

(21) Appl. No.: 11/329,358

(22) Filed: Jan. 10, 2006

(65) Prior Publication Data

US 2006/0172492 A1 Aug. 3, 2006

(30) Foreign Application Priority Data

Jan. 28, 2005 (FR) .................................. 05 00896

(51) Int. Cl.
*H01L 21/4763* (2006.01)
*H01L 29/94* (2006.01)

(52) U.S. Cl. .................. 438/649; 438/651; 438/655; 438/664; 438/682; 257/288; 257/350; 257/384; 257/412; 257/E29.161; 257/E21.199; 257/E21.622; 257/E21.636

(58) Field of Classification Search .................. 438/649, 438/651, 655, 664, 682, 637, 638; 257/E21.579, 257/288, 350, 384, E29.161, E21.199, E21.622, 257/E21.636
See application file for complete search history.

(56) References Cited

U.S. PATENT DOCUMENTS

| 5,352,631 | A | 10/1994 | Sitaram et al. |
| 6,187,675 | B1 * | 2/2001 | Buynoski .................... 438/655 |
| 6,268,255 | B1 * | 7/2001 | Besser et al. ................ 438/303 |
| 6,306,698 | B1 * | 10/2001 | Wieczorek et al. .......... 438/197 |
| 6,458,678 | B1 * | 10/2002 | Spikes et al. ................ 438/592 |
| 6,562,717 | B1 | 5/2003 | Woo et al. |
| 6,562,718 | B1 | 5/2003 | Xiang et al. |
| 6,620,718 | B1 | 9/2003 | Wieczorek et al. |
| 6,657,244 | B1 | 12/2003 | Dokumaci et al. |
| 2002/0058402 | A1 * | 5/2002 | Wieczorek et al. .......... 438/586 |
| 2005/0079695 | A1 | 4/2005 | Carriere et al. |
| 2006/0121663 | A1 * | 6/2006 | Fang et al. .................. 438/199 |

OTHER PUBLICATIONS

Sim, et al, "Dual Work Function Metal Gates Using Full Nickel Silicidation of Doped Poly-Si," IEEE Electron Device Letters, IEEE Service Center, New York, NY, US, vol. 24, No. 10, Oct. 2003, pp. 631-633, XP001175119; ISSN: 0741-3106.
Preliminary French Search Report, FR 05 00896, dated Nov. 11, 2005.

* cited by examiner

*Primary Examiner*—Michelle Estrada
(74) *Attorney, Agent, or Firm*—Gardere Wynne Sewell LLP

(57) ABSTRACT

An MOS transistor with a fully silicided gate is produced by forming a silicide compound in the gate separately and independently of silicide portions located in source and drain zones of the transistor. To this end, the silicide portions of the source and drain zones are covered by substantially impermeable coatings. The coatings prevent the silicide portions of the source and drain zones from increasing in volume during separate and independent formation of the gate silicide compound. The silicide gate may thus be thicker than the silicide portions of the source and drain zones.

32 Claims, 2 Drawing Sheets

MOS TRANSISTOR WITH FULLY SILICIDED GATE

PRIORITY CLAIM

The present application claims priority from French Patent Application No. 05 00896 filed Jan. 28, 2005, the disclosure of which is hereby incorporated by reference.

BACKGROUND OF THE INVENTION

1. Technical Field of the Invention

The present invention relates to a process for producing a Metal-Oxide-Semiconductor (MOS) transistor whose gate incorporates a silicide-type chemical compound.

2. Description of Related Art

An MOS transistor with a fully silicided gate has well-known advantages over an MOS transistor with a gate made of polysilicon or made of a metal such as tungsten or molybdenum, or made of tantalum carbide, etc. In particular, a fully silicided gate has no electron depletion zone in contact with the gate dielectric of the transistor, so that the apparent gate capacitance is lower. Furthermore, when the gate is made of a silicide, it is definitively produced at the end of the transistor production process. The silicide material therefore incorporates much fewer impurities than another gate material formed at the start of the transistor production process, such as tungsten, molybdenum or tantalum carbide. Moreover, the silicide does not have to undergo the activation annealing of the source and drain zones, which is carried out at a temperature of up to about 1000° C. Thus, the thermal stability requirements imposed on a gate silicide compound are much less restrictive than those imposed on other materials that have to withstand such temperatures. The electronic properties of the gate, among which are included the electrical resistivity and the work function, are therefore better controlled.

To obtain a gate with few impurities and to have fewer constraints regarding the thermal stability of the gate material (at high temperatures of about 1000° C.), it is also known to produce a transistor with a false gate and then, at the end of the transistor production process, to replace the false gate with a definitive gate. Thus, the definitive material of the gate is not contaminated by impurities during production of the transistor. However, the use of a false gate is particularly complex, especially owing to the chemical-mechanical polishing of the first dielectric level, which must be stopped just at the top of the gate, the removal of the false gate and the formation of the definitive gate material only at the location thereof.

A transistor with a fully silicided gate is therefore particularly advantageous, especially because it is simple to produce and because the electronic properties of the gate can be well controlled. However, the following difficulty arises during its production. The silicide compound used for the gate may have several different chemical phases. In particular, there may be several stoichiometric ratios, that is to say several values of the metal/silicon atomic ratio. As an example, at least two compounds of the nickel silicide type exist, and a gate obtained by nickel silicidation has in general a first phase of formula $Ni_2Si$ in an upper part of the gate and a second phase of formula $NiSi$ in a lower part of the gate. The boundary separating these two phases is of irregular, and in general uncontrolled, shape so that the two phases—$Ni_2Si$ and $NiSi$—may be simultaneously in contact with the gate dielectric, or else only the $NiSi$ phase is in contact with the gate dielectric. But, certain electrical characteristics of MOS transistors, among which is included the transistor switching voltage, depend on the work function of the gate and therefore on the chemical phase of the gate material that is in contact with the gate dielectric. For a MOS transistor with a nickel silicide gate, these characteristics therefore vary unintentionally, for example between two transistors located at different points on the same silicon wafer, or between two transistors produced on different wafers, even though identical process parameters were used for both wafers. In particular, certain transistors may have a switching voltage similar to that of a transistor with an n-doped or p-doped polysilicon gate, while others may have a switching voltage corresponding to a metal gate, the Fermi level of which lies within the bandgap of the substrate (in what are called "mid-gap" transistors).

To prevent the boundary separating the two phases, $Ni_2Si$ and $NiSi$, from reaching the gate dielectric, MOS transistors are produced with a thick nickel silicide gate. For example, the gate has a thickness of the order of 100 nanometers. In this case, only the $NiSi$ phase is in contact with the gate dielectric layer, so that the resulting transistors have a constant and well-defined switching voltage. Furthermore, the gate has a low electrical resistivity, compatible with use of the transistor in the microwave range.

However, portions of silicide compound are also needed in the source and drain zones of the transistor in order to obtain low electrical contact resistances in these zones. These silicide portions of the source and drain zones must be thin in order to avoid leakage currents from appearing in the electrical junctions between the source and the channel of the transistor on the one hand, and between the channel of the transistor and the drain on the other. The formation of the silicide compound for the gate then has to be dissociated from the formation of the silicide compound for the source and drain zones of the transistor, so as to produce a sufficiently thick silicide gate, but thin silicide portions in the source and drain zones.

However, such a dissociation between the formation of the silicide compound for the gate on the one hand, and the formation of the silicide compound for the source and drain zones on the other, requires adding steps to the transistor production process. In particular, at least one CMP polishing step is needed and/or at least one masking step. Such additional steps are disadvantageous, as they increase the risk of introducing impurities and/or particles into certain parts of the transistor. Furthermore, during an additional CMP polishing step, the repeatability and uniformity of the polishing carried out may be difficult to control. Likewise, an additional photolithography step introduces alignment difficulties during masking. In general, dissociating the formation of the silicide compound for the gate on the one hand and that for the source and drain zones on the other, results in an increase in the manufacturing costs of an electronic circuit that incorporates transistors obtained in this way.

There is accordingly a need for a process for producing an MOS transistor with a fully silicided gate that does not have the abovementioned drawbacks.

SUMMARY OF THE INVENTION

To do this, the invention provides a process for producing an MOS transistor which comprises the following steps:

a) production of an initial gate structure above a semiconductor substrate, comprising:
   - a gate dielectric layer placed on part of the surface of the substrate,
   - a gate portion made of a silicon-based material, placed on an opposite side of the gate dielectric layer from the substrate, and a spacer that surrounds, parallel to the surface of the substrate, the gate dielectric layer and the gate portion;

b) formation of two portions of a compound of the type comprising a silicide of a first metal on the surface of the substrate, in source and drain zones of the transistor that are located on either side of the gate structure;

c) formation of two coatings that are substantially impermeable to atoms of a second metal, on the silicide portions of the source and drain zones, respectively;

d) deposition of a layer of the second metal on the gate structure and in the source and drain zones so that part of the second metal is in contact with the gate portion; and e) heating of the transistor so as to induce a silicidation reaction between the second metal and the silicon material of the gate portion.

Thus, a process according to the invention comprises two separate sequences of silicide compound formation. During the first of these sequences, which corresponds to step b) of the process, portions of silicide compound from the first metal are formed in the source and drain zones, respectively. Steps d) and e) of the process constitute the second sequence, during which a portion of silicide compound from the second metal is formed in the gate portion of the transistor. By forming, between these two sequences, coatings that are substantially impermeable to the atoms of the second metal on the silicide portions of the source and drain zones, the latter portions are not increased during the second sequence. The thickness of the gate portion made of silicide compound from the second metal is therefore independent of the thicknesses of the silicide compound portions obtained from the first metal for the source and drain zones.

In particular, it may be greater than these thicknesses, so that the transistor obtained has the following advantages:

the silicide portions for the source and drain zones may be produced directly from silicon atoms from the substrate. No additional silicon deposition is necessary in these zones, before supplying the first metal that is used in the composition of the silicide of the source and drain zones. In other words, no selective epitaxial regrowth is needed in the source and drain zones. The transistor production process is therefore simplified;

the thicknesses of the silicide portions of the source and drain zones may be small, so that no leakage current appears in the respective channel-source and channel-drain junctions of the transistor;

the thickness of the gate-forming silicide portion in the direction perpendicular to the surface of the substrate may be large. In this way, even if the gate portion does have an irregular boundary separating two phases of the silicide of the second metal, such a boundary does not reach the interface between the gate portion and the gate dielectric layer. The switching voltage of the transistor is therefore well defined by the silicide phase that is in contact with the gate dielectric layer; and, finally, the thickness of the gate portion may also be large enough for the gate to have a low resistance per square, measured parallel to the surface of the substrate. The transistor obtained is then suitable for applications in the microwave field, without the gate generating signal delays or any perturbation in the operation of an integrated electronic circuit that incorporates the transistor.

According to a preferred method of implementing the invention, the initial gate structure further includes a mask placed above the gate portion, on an opposite side thereof from the gate dielectric layer. This mask may have at least one of the following two roles:

transversely limiting an implantation of dopants of the substrate into the source and drain zones, by preventing particles of an implantation beam from reaching the substrate beneath the gate structure or even the gate portion itself. One type of electrical doping and a concentration of dopants in the substrate zone intended to constitute the channel of the transistor, which are fixed during step a) of the process, are thus preserved during implantation of the source and drain zones; and/or preventing atoms of the first metal used in the composition of the silicide of the source and drain zones from coming into contact with the silicon material for the gate portion. Thus, no silicide-type compound is formed in the gate portion during the first silicide formation sequence, that is to say while the silicide portions for the source and drain zones are being formed. The silicide material formed in the gate portion is then better defined, since it contains no atoms of the first metal.

The mask is then removed before step d) of the process of the invention.

Optionally, the process may further include, before step c), a thinning of the mask placed above the gate portion. In this way, the mask may have, before it is thinned, a thickness sufficient to effectively limit implantation of the source and drain zones, and it may be entirely removed before step d) while still preserving residual coatings on the silicide portions of the source and drain zones, which are sufficient to prevent atoms of the second metal from penetrating into said silicide portions during step e). The volumes of the silicide portions for the source and drain zones therefore remain approximately constant during step e).

According to one particular method of implementing the invention, the first metal used in the composition of the silicide for the source and drain zones, and the second metal, used in the composition of the silicide for the gate portion, may be the same.

The invention also provides an integrated electronic circuit that comprises at least one MOS transistor produced using a process as described above. Such a circuit possesses well-defined operating characteristics.

In accordance with an embodiment of the invention, a method is presented for fabricating a MOS transistor having gate, source and drain structures, comprising siliciding polysilicon regions at the source and drain structures with a first type metal, and separately and independently siliciding a region at the gate structure with a second type metal.

In accordance with another embodiment, a MOS transistor comprises a gate structure, a source structure and a drain structure. First-type metal silicided polysilicon regions are formed at the source and drain structures. A second-type metal silicided region is separately and independently formed at the gate structure.

BRIEF DESCRIPTION OF THE DRAWINGS

Other characteristics and advantages of the invention will become further apparent on reading the description which follows. The latter is purely illustrative and should be read in conjunction with the appended drawings, in which.

DETAILED DESCRIPTION OF THE DRAWINGS

For the sake of clarity, the dimensions of the various elements shown in these figures have not been drawn to scale. The figures are sectional views of an approximately planar substrate, considered in a plane perpendicular to the surface of the substrate. The substrate is in the lower part of each figure, and N denotes a direction perpendicular to the surface of the substrate and oriented upwards in the figures. In what follows, the terms "on", "under", "lower" and "upper" are used with reference to this orientation. Moreover, in all the figures identical references correspond to identical elements.

The elementary steps of the process for fabricating an integrated electronic circuit, which are known to those skilled in the art, will not be discussed in detail below. Only a succession of elementary steps for producing an MOS transistor according to the invention will be described.

Figure 1:
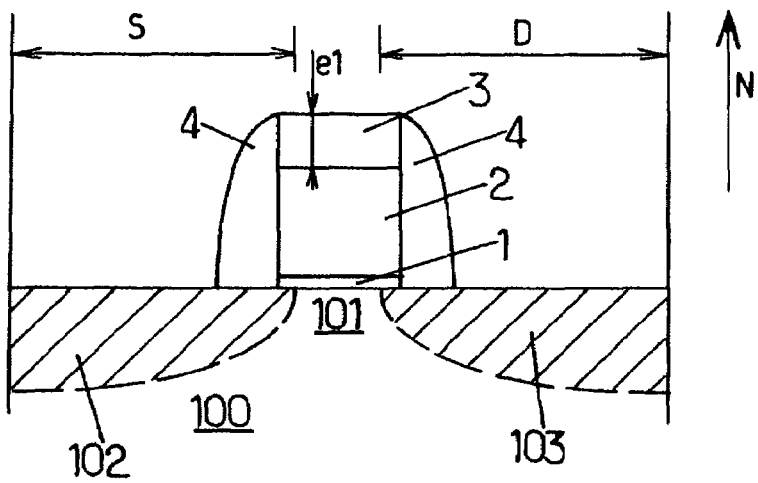
FIGS. 1-6 illustrate various steps of a process according to the invention.

FIG. 1 shows an integrated electronic circuit during fabrication. In particular, fabrication steps have already been carried out in order to produce an MOS (Metal-Oxide-Semiconductor) transistor on the surface of a substrate 100 of the circuit. The substrate 100 is made of single-crystal silicon. The following elements of the transistor have thus already been produced: a gate dielectric layer 1; a silicon portion 2 intended to form the gate of the transistor; a mask 3; and a spacer 4 that surrounds the layer 1, the portion 2 and the mask 3 parallel to the surface of the substrate 100. The layer 1 may be made of silica ($SiO_2$) and may have a thickness for example of 1.2 nanometers in the direction N. The portion 2 may have a thickness, in the direction N, of between 30 and 200 nanometers. The mask 3 may be made of silica ($SiO_2$) or titanium nitride (TiN). The spacer 4 may be made of silicon nitride ($Si_3N_4$). Alternatively, it may be formed from a multilayer consisting of several electrically insulating layers. The elements of the transistor 1 to 4 may be formed simultaneously on the surface of the substrate 100 at several locations for MOS transistors of the integrated circuit. Each assembly of these elements constitutes an initial gate structure.

The substrate 100 is initially doped so as to obtain appropriate electrical conduction in a zone 101 of the substrate 100 lying beneath the portion 2. The zone 101 is intended to form the channel of the transistor.

In a known manner, steps for doping the substrate 100 in source and drain zones, denoted respectively by S and D and located on each side of the zone 101, are carried out after the spacer 4 has been formed. During these steps, zones of the substrate 100 that correspond to sources or drains of p-MOS transistors are selectively doped with boron (B) ions and zones of the substrate 100 that correspond to sources or drains of n-MOS transistors are selectively doped with arsenic (As) or phosphorus (P) ions. Those parts of the substrate 100 thus doped bear the references 102 and 103, for the source zone S and the drain zone D respectively.

The mask 3 has a sufficient thickness e1, in the direction N, to prevent any ion for doping the zones S and D to be able to pass through it and penetrate the zone 101. As an example, e1 may be equal to 20 nanometers.

Figure 2:
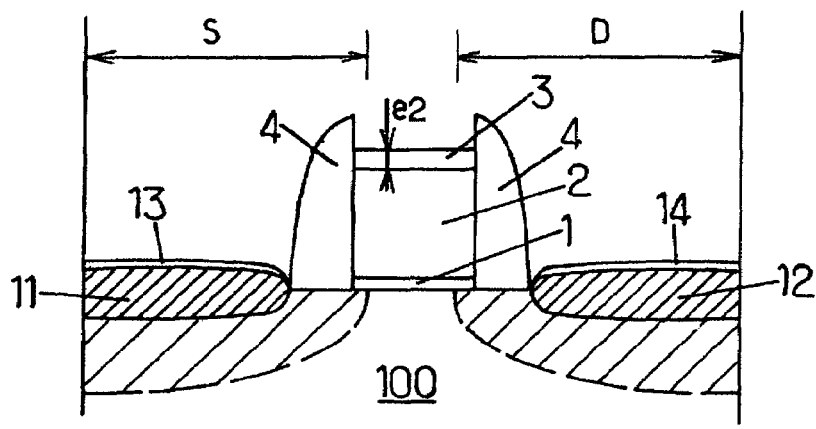

If the mask 3 is made of a material whose etching rate is low, with the etching process that will be used subsequently, the mask 3 is thinned to a thickness e2 of less than e1 (FIG. 2). For example, e2 may be about 3 to 4 nanometers. This thinning is carried out by etching the mask 3 selectively with respect to the material of the spacer 4 and with respect to the material of the substrate 100 that is exposed in the zones S and D. When the mask 3 is made of silica ($SiO_2$), the thinning of the mask may be carried out by wet etching, using an etching solution containing hydrofluoric acid (HF). Such thinning is unnecessary when the mask 3 is made of titanium nitride (TiN), which can be selectively etched at a sufficient rate in the rest of the process.

Portions 11 and 12 of a compound of the metal silicide type denoted by $SiM1_x$, where M1 is a first metal and x is a stoichiometric coefficient, are then formed selectively on the surface of the substrate 100 in the zones S and D. To this end, a standard silicidation process well known to those skilled in the art may be used. According to this process, the silicon atoms of the $SiM1_x$ compound come from the substrate 100 and the atoms of the metal M1 are provided by depositing a continuous layer of metal M1 over the entire circuit. When the circuit is heated, the atoms of metal M1 diffuse into the substrate 100 and form the silicide compound $SiM1_x$ by a chemical silicidation reaction. In this way, the portions 11 and 12 are located level with the surface of the substrate 100 in the direction N. The portions 11 and 12 provide low electrical contact resistances for the contacts on the zones S and D, when such electrical contacts are produced subsequently in the fabrication of the integrated circuit. The metal M1 may for example be cobalt (Co) or nickel (Ni). Excess metal M1 that has not reacted with silicon atoms of the substrate 100 in the zones S and D is removed.

The gate portion 2 is separated from the layer of metal M1 by the mask 3. For this reason, no compound of the type comprising a silicide of the metal M1 is formed in the portion 2.

Coatings, selected for being substantially impermeable to the atoms of a second metal, are then formed on the portions 11 and 12. These coatings may for example be formed by the oxidation of respective upper parts of the portions 11 and 12. Such a surface oxidation of the portions 11 and 12 may be carried out by bringing an oxidizing fluid into contact with the circuit via its upper face. The oxidizing fluid reacts chemically with the silicide material of the portions 11 and 12, so that films 13 and 14 made of an oxysilicide of the metal M1 are formed on the portions 11 and 12 respectively. The chemical formula of the metal M1 oxysilicide compound thus formed is $SiM1_yO_z$, where y and z are stoichiometric coefficients. The oxidizing fluid used may be a plasma containing oxygen atoms or a gas such as ozone $O_3$. In the case of a plasma, at least some of the oxygen atoms may be introduced in ozone form into the plasma. The films 13 and 14 constitute respective coatings for the portions 11 and 12. Such a method for forming the coatings 13 and 14 is particularly rapid and well controlled, so that the manufacturing cost of the electronic circuit is not appreciably increased.

The mask 3, or that part of the mask that remains after the optional thinning has been carried out, is then completely removed. To do this, an etching process is used, this being selected according to the material of the mask 3. When the mask 3 is made of titanium nitride (TiN), an oxidation etching process, for example wet etching (using $H_2O_2/NH_4OH/H_2O$), selectively removes the mask 3 without impairing the coatings 13 and 14, nor the spacer 4. When the mask 3 is made of silica ($SiO_2$), a wet etching process is appropriate, but using an etching solution containing hydrofluoric acid (HF). Such a process rapidly removes the silica material of the mask 3 without the coatings 13 and 14 being substantially impaired by the etching solution. To do this, the residual thickness e2 of the mask 3 must not be too great, so that the mask 3 is completely dissolved in the etching solution before the portions 13 and 14 themselves are dissolved or impaired significantly. The inventors have found that an e2 value of about 3 to 4 nanometers is appropriate when the thickness of the coatings 13 and 14 is about 4 nanometers. In general, a silica mask 3 is selectively etched with respect to the $SiM1_yO_z$ compound of the coatings 13 and 14 when the thickness e2 is approximately equal to the respective thicknesses of the coatings 13 and 14.

The upper surface of the gate portion 2 is then exposed.

Figure 3:
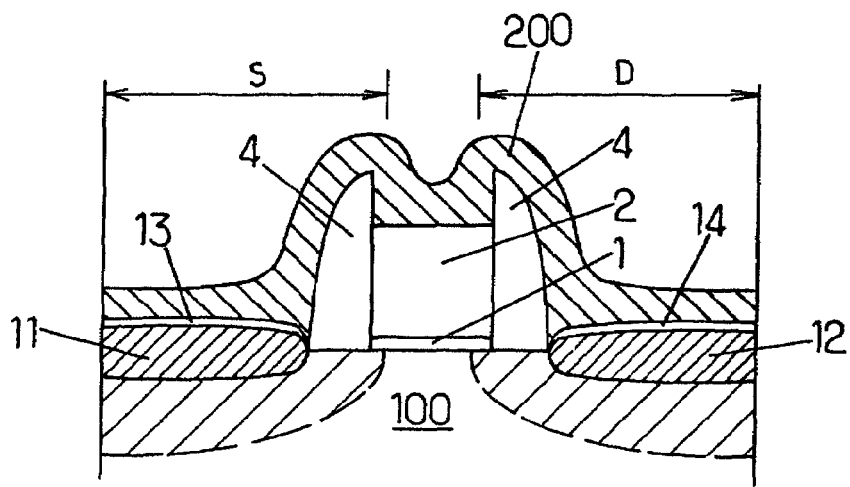

As shown in FIG. 3, a layer 200 of a second metal, denoted by M2, is deposited on the circuit. Such a metal is deposited using one of the known processes, such as the PVD (physical vapor deposition) process. The layer 200 is continuous and covers the initial gate structure and the coatings 13 and 14 above the silicide portions 11 and 12.

The metal M2 of the layer 200 is therefore in contact with the silicon of the gate portion 2 at the upper surface thereof. Heating the circuit then causes a silicidation reaction between the metal M2 and the silicon of the portion 2 so that one or more compounds of the type consisting of a silicide of the metal M2 are formed in the portion 2.

Moreover, the layer 200 is isolated from the silicide portions 11 and 12 by the coatings 13 and 14, respectively. Thanks to this isolation, no chemical reaction can take place between the metal M2 of the layer 200 and the silicon material of the substrate 100 in the zones S and D.

In one advantageous method of implementing the invention, the silicidation reaction of the gate portion 2 is carried out in several steps, so as to control the amount and the distribution of the metal M2 that enters the final composition of the gate of the transistor. To do this, step e) of the process, mentioned in the general part of the description, may comprise, in succession:

e1) first heating of the transistor so as to form an intermediate silicide-type compound from the metal M2 of the layer 200 and from part of the silicon material of the portion 2;

e2) removal of part of the metal M2 of the layer 200 that has not participated in the formation of the intermediate compound; and e3) second heating of the transistor so as to form a final silicide-type compound from the metal M2 in part of the gate portion in contact with the gate dielectric layer.

Figure 4:
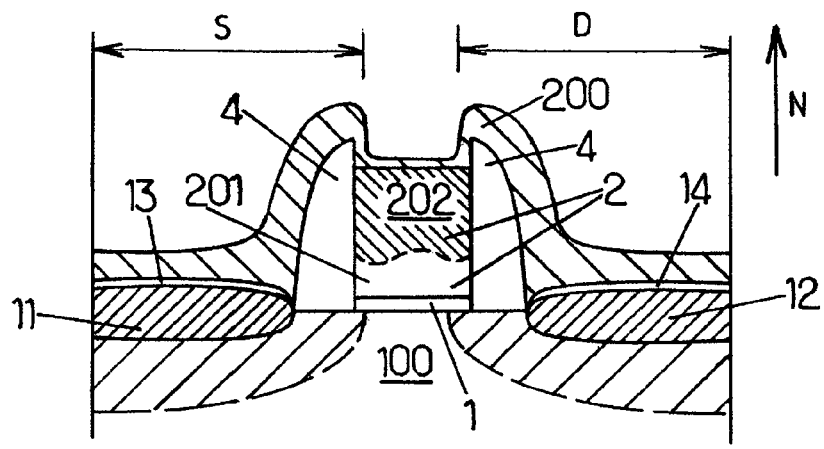
Figure 5:
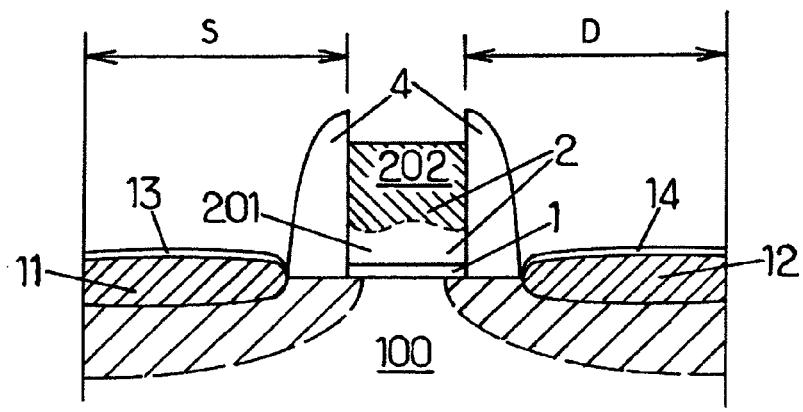
Figure 6:
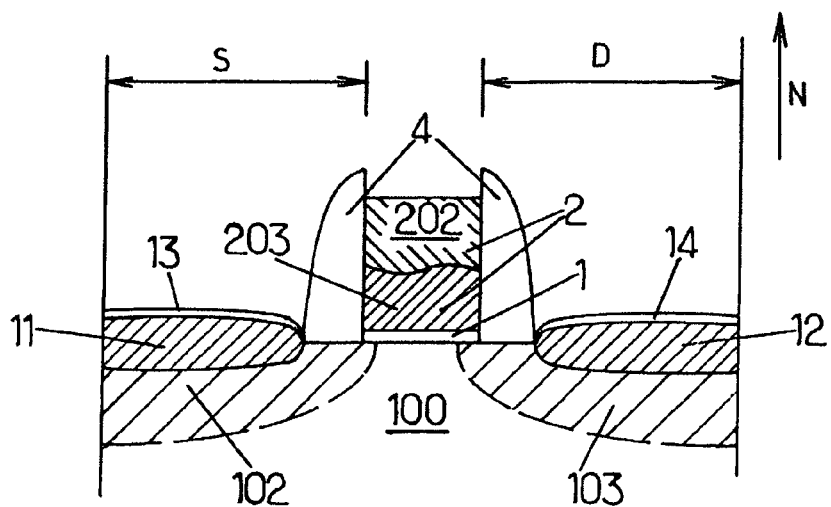

FIGS. 4, 5 and 6 illustrate the configuration of the transistor after each of steps e1), e2) and e3), respectively.

During the first heating of step e1), part of the metal M2 of the layer 200 diffuses into the gate portion 2 through the upper surface thereof (FIG. 4). An intermediate compound of the type consisting of a silicide of the metal M2 is thus formed in an upper part of the portion 2, with the reference 202. A lower part of the portion 2, with the reference 201, is not reached at this stage by atoms of the metal M2. During step e1), the coatings 13 and 14 remain impermeable to the atoms of the metal M2: no atom of the metal M2 passes through the coatings 13 and 14, so that the respective composition and volumes of the silicide portions 11 and 12 remain constant.

Some of the metal M2 of the layer 200 does not react with the silicon material of the portion 2 during step e1). This remainder is then selectively removed in step e2) employing, for example, a wet etching process using an acid etching solution. Such an etching process has no effect on the intermediate compound formed in the portion 2, nor on the $SiM1_yO_x$ compound of the coatings 13 and 14. It also has no effect on the material of the spacer 4. FIG. 5 illustrates the configuration of the transistor that is then obtained.

The second heating of step e3) activates the diffusion of the atoms of the metal M2 contained in the part 202 of the gate portion 2. This results in a more uniform distribution of the atoms of the metal M2 (FIG. 6): the part 202 containing the silicide-type intermediate compound is reduced and atoms of the metal M2 diffuse from the part 202 into a lower part of the portion 2. This lower part of the portion 2 has the reference 203. It extends down to the interface between the portion 2 and the layer 1, and it contains atoms of the metal M2 in a different proportion from that of the part 202. Thus, the part 203 is made of a final compound consisting of a silicide of the metal M2, the electronic characteristics of which determine the switching voltage of the transistor.

It should be noticed that the final silicide-type compound that is present in part 203 of the gate portion 2 is produced from the material of intermediate silicide-type compound formed in step e1) in part 202, and from residual silicon material of the gate portion 2 which remains after step e1) in the lower part of portion 2. After step e3), there may still remain some material of intermediate silicide-type compound in the upper part of gate portion 2, but this latter is not in contact with gate dielectric layer 1.

The metal M2 may be selected in various ways, depending on the desired switching voltage of the transistor. As is known, by selecting erbium (Er) as metal M2, the resulting erbium silicide compound of the part 203 of the gate portion 2 has a work function equal in absolute value to the conduction band energy of an n-doped polysilicon material. Similarly, by selecting platinum (Pt) as metal M2, the resulting platinum silicide compound in the part 203 of the portion 2 has a work function equal in absolute value to the valence band energy of a p-doped polysilicon material. For these two selections of the metal M2, the switching voltage of the transistor obtained is therefore approximately equal to that of a transistor with an n-doped or p-doped polysilicon transistor.

To obtain in this manner an integrated electronic circuit that incorporates transistors having gates of both types, it is necessary to deposit an erbium layer in certain zones of the substrate 100 and a platinum layer in other zones of the substrate 100. This may be carried out by combining erbium and platinum depositions with masking steps. Steps e1) to e3) can therefore produce simultaneously an erbium silicide material in the gate portions of certain transistors of the integrated circuit and a platinum silicide material in the gate portions of other transistors of the circuit. A combination of transistors similar to that of a CMOS (Complementary Metal-Oxide-Semiconductor) integrated circuit results therefrom.

Preferably, nickel (Ni) is chosen as metal M2. In this case, the final gate compound produced by the silicidation reaction between the metal M2 of the layer 200 and the silicon material of the gate portion 2 is a nickel silicide with a nickel/silicon stoichiometric ratio of approximately 1. In other words, the compound present in the gate part 203 in contact with the gate dielectric layer 1 possesses a composition close to NiSi. Likewise, the intermediate compound present in the gate part 202 is a nickel silicide having a nickel/silicon stoichiometric ratio of approximately 2, namely $Ni_2Si$.

Now, the boron, phosphorus and arsenic ions used to electrically dope the silicon are almost insoluble in the $Ni_2Si$ compound, and are insoluble in the NiSi compound. It is therefore advantageous, when producing several initial gate structures on one and the same circuit substrate, to form certain gate portions 2 from p-doped silicon and other gate portions 2 from n-doped silicon. During the heating of step e1), the $Ni_2Si$ compound being formed in each upper part 202 of the gate portion 2 has the effect of forcing the dopant ions into the lower part 201 of this portion 2. After step e3), the dopant ions of each gate portion 2 are then concentrated in the part 203 of this portion 2, in contact with the gate dielectric layer 1. However, boron ions, which are insoluble in the NiSi compound, and are forced into the NiSi/gate dielectric interface, give the NiSi compound a work function close to the valence band energy of silicon, that is to say close to 5.1 eV (electron volts). Likewise, phosphorus or arsenic ions forced into the NiSi/gate dielectric interface give the NiSi compound a work function close to the conduction band energy of silicon, that is to say close to 4.1 eV. In this way it is therefore possible to obtain, simultaneously in one and the same integrated circuit, transistors having a switching voltage approximately equal to that of n-MOS transistors produced with a polysilicon gate and transistors having a switching voltage approximately equal to that of p-MOS transistors produced with a polysilicon gate. The electronic circuit designs that are possible in CMOS technology can therefore be adopted using a transistor production process according to the invention.

The nickel layer 200 may be deposited over the entire circuit, in those zones of the substrate 100 which correspond to final n-MOS or p-MOS transistors. In the jargon of those skilled in the art, this is called "full-wafer" deposition. It is therefore particularly simple and rapid. The two types of MOS transistor produced in the circuit are initially differentiated by different dopings of the corresponding silicon gate portions.

It will be understood that the process of the invention can be adapted in order to meet particular requirements of the final circuit. However, the following advantages of the process that has been described in detail above are reiterated:

- the process introduces no additional CMP polishing step for the circuit;
- it is unnecessary to heighten the source and drain zones in order to produce silicide portions in these zones without causing leakage currents in the channel junctions;
- the electrical characteristics of the transistors obtained, in particular the switching voltage values, are well controlled; and
- the gate portions of the transistors have a low resistance per square.

Finally, it should be pointed out that the coatings 13 and 14, on the portions 11 and 12 respectively, do not impede the production of electrical contacts for the source and drain. This is because, to produce such contacts, an intermetallic first level layer, made of an electrically insulating material, is deposited on the entire circuit. This layer is then etched above the portions 11 and 12 until conducting parts of these portions are exposed. The recessed volumes thus formed in the intermetallic first level layer are then filled with electrically conductive material in order to make electrical connections. Advantageously, the coatings 13 and 14 are etched at the same time as the intermetallic first level layer so that no additional process step is added for electrically connecting the transistor.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A process for producing an MOS transistor, comprising the following steps:
    a) production of an initial gate structure above a semiconductor substrate, said initial structure comprising:
        a gate dielectric layer placed on part of the surface of the substrate,
        a gate portion made of a silicon-based material, placed on an opposite side of the gate dielectric layer from the substrate, and
        a spacer that surrounds, parallel to the surface of the substrate, the gate dielectric layer and the gate portion;
    b) formation of two portions of a compound of the type comprising a silicide of a first metal on the surface of the substrate, in source and drain zones of the transistor that are located on either side of the gate structure;
    c) formation of two coatings that are impermeable to-atoms of a second metal, on the silicide portions of the source and drain zones, respectively;
    d) deposition of a layer of the second metal on the gate structure and in the source and drain zones so that part of the second metal is in contact with the gate portion; and
    e) heating of the transistor so as to induce a silicidation reaction between the second metal and the silicon material of the gate portion, wherein step e) comprises:
        e1) first heating of the transistor so as to form an intermediate silicide-type compound from the second metal and from part of the silicon material of the gate portion;
        e2) removal of part of the second metal that has not participated in the formation of said intermediate compound; and
        e3) second heating of the transistor so as to form a final silicide-type compound of the second metal in part of the gate portion which is in contact with the gate dielectric layer.

2. The process according to claim 1, wherein the initial gate structure further includes a mask placed above the gate portion, on an opposite side of said gate portion from the gate dielectric layer, and wherein said mask is then removed before step d).

3. The process according to claim 2, which further includes, before step c), a thinning of the mask so that said mask is entirely removed before step d) while still preserving residual coatings on the silicide portions of the source and drain zones, said residual coatings being sufficient to prevent atoms of the second metal from penetrating into said silicide portions during step e).

4. The process according to claim 1, wherein the coatings of the silicide portions of the source and drain zones are formed by the oxidation of respective upper parts of said silicide portions.

5. The process according to claim 4, wherein the oxidation of the respective upper parts of the silicide portions of the source and drain zones is carried out by bringing an oxidizing fluid into contact with said silicide portions.

6. The process according to claim 5, wherein the oxidizing fluid is a plasma containing oxygen atoms.

7. The process according to claim 6, wherein at least some of the oxygen atoms are introduced in ozone form into the plasma.

8. The process according to claim 1, wherein the first and second metals are the same.

9. The process according to claim 1, wherein the second metal comprises nickel.

10. The process according to claim 9, wherein the final silicide-type compound formed in the gate portion in contact with the gate dielectric layer is a nickel silicide having a nickel/silicon stoichiometric ratio of approximately 1.

11. The process according to claim 1, wherein the second metal comprises nickel, and wherein the intermediate silicide-type compound formed from the second metal and from a part of the silicon material of the gate portion is a nickel silicide having a nickel/silicon stoichiometric ratio of approximately 2.

12. The process according to claim 11, wherein the final silicide-type compound formed in the gate portion in contact with the gate dielectric layer is a nickel silicide having a nickel/silicon stoichiometric ratio of approximately 1.

13. The process according to claim 10, wherein the gate portion is doped with a selected one of boron, phosphorus and/or arsenic atoms in the initial gate structure produced in step a).

14. An integrated electronic circuit comprising at least one MOS transistor produced according to process of claim 1.

15. A method for fabricating a MOS transistor having gate, source and drain structures, comprising:
siliciding polysilicon regions at the source and drain structures with a first type metal; and
separately and independently siliciding a region at the gate structure with a second type metal to form a fully silicided gate which is in contact with an underlying gate dielectric layer;
wherein separately and independently siliciding for the gate structure comprises:
depositing of a layer of the second type metal over at least the gate structure;
first heating so as to form an intermediate second metal type silicide with respect to part of a silicon material of the gate structure;
removing of part of the second type metal that has not participated in the formation of said intermediate silicide; and
second heating so as to form a final second metal type silicide with respect to the gate structure comprising an upper silicide layer and a lower silicide layer, the lower silicide layer in contact with the underlying gate dielectric layer.

16. The method of claim 15 wherein the first type metal is selected from the group consisting of nickel and cobalt, and the second type metal is selected from the group consisting of erbium, platinum, and nickel.

17. A method for fabricating a MOS transistor having gate, source and drain structures, comprising:
siliciding polysilicon regions at the source and drain structures with a first type metal; and
separately and independently siliciding a region at the gate structure with a second type metal, wherein separately and independently siliciding for the gate structure comprises:
depositing of a layer of the second type metal over at least the gate structure;
first heating so as to form an intermediate second metal type silicide with respect to part of a silicon material of the gate structure;
removing of part of the second type metal that has not participated in the formation of said intermediate silicide; and
second heating so as to form a final second metal type silicide with respect to the gate structure comprising an upper silicide layer and a lower silicide layer,
wherein the lower silicide layer contacts a gate dielectric layer of the gate structure.

18. A method for fabricating a MOS transistor having gate, source and drain structures, comprising:
siliciding polysilicon regions at the source and drain structures with a first type metal; and
separately and independently siliciding a region at the gate structure with a second type metal to form a fully silicided gate which is in contact with an underlying gate dielectric layer;
wherein separately and independently siliciding for the gate structure comprises:
masking the region of the gate structure from the first type metal, the mask precluding gate structure siliciding when the polysilicon regions at the source and drain structures are silicided with the first type metal;
removing the first type metal and mask from the region of the gate structure; and
depositing of a layer of the second type metal over at least the gate structure.

19. The method of claim 18 wherein separately and independently siliciding for the gate structure further comprises:
first heating so as to form an intermediate second metal type silicide with respect to part of a silicon material of the gate structure;
removing of part of the second type metal that has not participated in the formation of said intermediate silicide; and
second heating so as to form a final second metal type silicide with respect to the gate structure comprising an upper silicide layer and a lower silicide layer.

20. The method of claim 15 wherein the upper silicide layer has a first stoichiometric ratio and the lower silicide layer has a second stoichiometric ratio.

21. The method of claim 20 wherein the upper layer has a second metal type/silicon stoichiometric ratio of approximately 2, and wherein the lower layer has a second metal type/silicon stoichiometric ratio of approximately 1.

22. The method of claim 15 further comprising:
doping a silicon layer of the gate structure with a selected doping atom; and
wherein the first and second heating forces the doping atoms towards a lower part of the silicon material of the gate structure; and
wherein the lower silicide layer has a higher concentration of the doping atom than the upper silicide layer.

23. The method of claim 22 wherein the upper silicide layer has a first metal/silicon stoichiometric ratio and the lower silicide layer has a second metal/silicon stoichiometric ratio.

24. The method of claim 23 wherein the first stoichiometric ratio is approximately 2, and wherein the second stoichiometric ratio is approximately 1.

25. The method of claim 22 wherein the selected doping atom is selected from the group consisting of boron, phosphorus and arsenic.

26. A MOS transistor, comprising:
a gate structure;
a source structure;
a drain structure;
first-type metal silicided polysilicon regions at the source and drain structures; and
a second-type metal, separately and independently silicided region at the gate structure to form a fully silicided gate including an upper second-type metal silicide layer and a lower second-type metal silicide layer in contact with the upper silicide layer, wherein the lower silicide layer is in contact with an underlying gate dielectric layer.

27. The transistor of claim 26 wherein the first type metal is selected from the group consisting of nickel and cobalt, and the second type metal is selected from the group consisting of erbium, platinum, and nickel.

28. A MOS transistor comprising:
a gate structure;
a source structure;
a drain structure;
first-type metal silicided polysilicon regions at the source and drain structures; and
a second-type metal, separately and independently silicided region at the gate structure, wherein the second-type metal, separately and independently silicided region for the gate structure comprises:
an upper second-type metal silicide layer; and a lower second-type metal silicide layer, wherein the lower silicide layer contacts a gate dielectric layer of the gate structure.

29. The transistor of claim 26 wherein the upper silicide layer has a first stoichiometric ratio and the lower silicide layer has a second stoichiometric ratio.

30. The transistor of claim 26 wherein the upper layer has a second metal type/silicon stoichiometric ratio of approximately 2, and wherein the lower layer has a second metal type/silicon stoichiometric ratio of approximately 1.

31. The transistor of claim 26 wherein a silicon layer of the gate structure is doped with a selected doping atom, and the separate and independent siliciding forces the doping atoms towards a lower part of the silicon layer such that the lower silicide layer has a higher concentration of the doping atom than the upper silicide layer.

32. The transistor of claim 31 wherein the selected doping atom is selected from the group consisting of boron, phosphorus and arsenic.

* * * * *

UNITED STATES PATENT AND TRADEMARK OFFICE
CERTIFICATE OF CORRECTION

PATENT NO. : 7,638,427 B2
APPLICATION NO. : 11/329358
DATED : December 29, 2009
INVENTOR(S) : Froment et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 892 days.

Signed and Sealed this

Ninth Day of November, 2010

David J. Kappos
*Director of the United States Patent and Trademark Office*